United States Patent
Preuß et al.

(10) Patent No.: US 9,490,397 B2
(45) Date of Patent: Nov. 8, 2016

(54) METHOD FOR PRODUCING AN OPTOELECTRONIC SEMICONDUCTOR DEVICE, AND OPTOELECTRONIC SEMICONDUCTOR DEVICE

(71) Applicant: OSRAM Opto Semiconductors GmbH, Regensburg (DE)

(72) Inventors: Stephan Preuß, Bad Abbach (DE); Michael Zitzlsperger, Regensburg (DE); Caroline Kistner, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 14/654,500

(22) PCT Filed: Dec. 17, 2013

(86) PCT No.: PCT/EP2013/076977
§ 371 (c)(1),
(2) Date: Jun. 19, 2015

(87) PCT Pub. No.: WO2014/095923
PCT Pub. Date: Jun. 24, 2014

(65) Prior Publication Data
US 2015/0333232 A1    Nov. 19, 2015

(30) Foreign Application Priority Data

Dec. 21, 2012 (DE) .......... 10 2012 113 003

(51) Int. Cl.
*H01L 29/49* (2006.01)
*H01L 33/48* (2010.01)
(Continued)

(52) U.S. Cl.
CPC .......... *H01L 33/486* (2013.01); *H01L 24/97* (2013.01); *H01L 33/54* (2013.01); *H01L 33/60* (2013.01); *H01L 33/62* (2013.01); *H01L 33/505* (2013.01);
(Continued)

(58) Field of Classification Search
CPC ....... H01L 33/60; H01L 24/97; H01L 33/54; H01L 33/62
See application file for complete search history.

(56) References Cited

U.S. PATENT DOCUMENTS

| 882,319 | A | * | 3/1908 | Huebschwerlen et al. ............... E01B 11/08 238/243 |
| 7,208,769 | B2 | | 4/2007 | Guenther et al. |

(Continued)

FOREIGN PATENT DOCUMENTS

| DE | 102004021233 A1 | 12/2005 |
| DE | 102008011153 A1 | 5/2009 |

(Continued)

*Primary Examiner* — Michael Shingleton
(74) *Attorney, Agent, or Firm* — Slater Matsil, LLP

(57) ABSTRACT

A method for producing an optoelectronic thin-film chip semiconductor device is specified. A conductor structure is applied on a carrier and a multiplicity of optoelectronic semiconductor chips are arranged between the conductor structures. Each of the optoelectronic semiconductor chips includes a layer at a top side. Furthermore, electrical connections between semiconductor chip and the conductor structure are established, for instance using a bonding wire. The semiconductor chips and the conductor structure are surrounded with a molded body. The molded body does not project beyond the optoelectronic semiconductor chips at the top side thereof facing away from the carrier. Moreover, the carrier is removed and the semiconductor chips surrounded by molding are singulated.

9 Claims, 3 Drawing Sheets

(51) Int. Cl.
  *H01L 33/60*   (2010.01)
  *H01L 33/62*   (2010.01)
  *H01L 33/54*   (2010.01)
  *H01L 23/00*   (2006.01)
  *H01L 33/50*   (2010.01)

(52) U.S. Cl.
  CPC ........... *H01L 2224/48091* (2013.01); *H01L 2224/48464* (2013.01); *H01L 2924/12041* (2013.01); *H01L 2924/12043* (2013.01); *H01L 2933/005* (2013.01); *H01L 2933/0033* (2013.01); *H01L 2933/0058* (2013.01); *H01L 2933/0066* (2013.01); *H01L 2933/0091* (2013.01)

(56) References Cited

U.S. PATENT DOCUMENTS

| | | | |
|---|---|---|---|
| 8,373,182 B2 | 2/2013 | Seko et al. | |
| 8,426,875 B2 | 4/2013 | Singer et al. | |
| 8,556,672 B2 | 10/2013 | Imazu | |
| 8,647,898 B2* | 2/2014 | Chang | H01L 33/504 257/E33.061 |
| 8,723,192 B2 | 5/2014 | Weidner et al. | |
| 8,860,062 B2 | 10/2014 | Schneider et al. | |
| 8,890,188 B2* | 11/2014 | Park | H01L 33/486 257/704 |
| 8,901,592 B2* | 12/2014 | Weidner | H01L 33/60 257/98 |
| 2005/0045903 A1 | 3/2005 | Abe et al. | |
| 2009/0212316 A1 | 8/2009 | Braune et al. | |
| 2010/0155917 A1 | 6/2010 | Maruo | |
| 2011/0049545 A1 | 3/2011 | Basin et al. | |
| 2012/0032182 A1* | 2/2012 | Sills | H01L 25/0753 257/76 |
| 2012/0074445 A1* | 3/2012 | Shimonishi | H01L 33/60 257/98 |
| 2012/0112220 A1* | 5/2012 | West | H01L 33/60 257/98 |
| 2012/0126264 A1* | 5/2012 | Chang | H01L 33/486 257/98 |
| 2012/0142124 A1 | 6/2012 | Yoo et al. | |
| 2012/0161179 A1* | 6/2012 | Fang | H01L 33/504 257/98 |
| 2012/0235169 A1* | 9/2012 | Seko | H01L 33/60 257/88 |
| 2012/0261699 A1* | 10/2012 | Ooyabu | H01L 33/56 257/98 |
| 2012/0299041 A1 | 11/2012 | Kräuter et al. | |
| 2012/0302124 A1 | 11/2012 | Imazu | |
| 2012/0305970 A1* | 12/2012 | Kim | H01L 33/504 257/98 |
| 2013/0193470 A1* | 8/2013 | Weidner | H01L 33/44 257/98 |
| 2013/0200412 A1 | 8/2013 | Ramchen et al. | |
| 2014/0034983 A1 | 2/2014 | Gebuhr et al. | |
| 2014/0042481 A1 | 2/2014 | Inoue et al. | |
| 2015/0262987 A1* | 9/2015 | Wada | H01L 33/505 257/98 |
| 2015/0280081 A1* | 10/2015 | Wada | H01L 33/505 438/27 |
| 2015/0325748 A1* | 11/2015 | Ting | H01L 33/38 257/98 |
| 2015/0333232 A1* | 11/2015 | Preu | H01L 33/486 257/99 |
| 2015/0333236 A1* | 11/2015 | Yoneda | H01L 33/58 257/98 |
| 2015/0333241 A1* | 11/2015 | Chen | H01L 33/644 257/93 |

FOREIGN PATENT DOCUMENTS

| | | | |
|---|---|---|---|
| DE | 102010024864 | * | 6/2010 |
| DE | 102010024864 A1 | | 12/2011 |
| DE | 102010027253 A1 | | 1/2012 |
| EP | 2390933 A1 | | 11/2011 |
| JP | 2006179718 A | | 7/2006 |
| JP | 2012059939 A | | 3/2012 |
| JP | 2012119673 A | | 6/2012 |
| WO | 2007025515 A1 | | 3/2007 |
| WO | 2009087584 A1 | | 7/2009 |
| WO | 2011015449 A1 | | 2/2011 |
| WO | 2011093454 A1 | | 8/2011 |
| WO | 2011160968 A1 | | 12/2011 |
| WO | 2012110147 A1 | | 8/2012 |
| WO | 2012144030 A1 | | 10/2012 |

\* cited by examiner

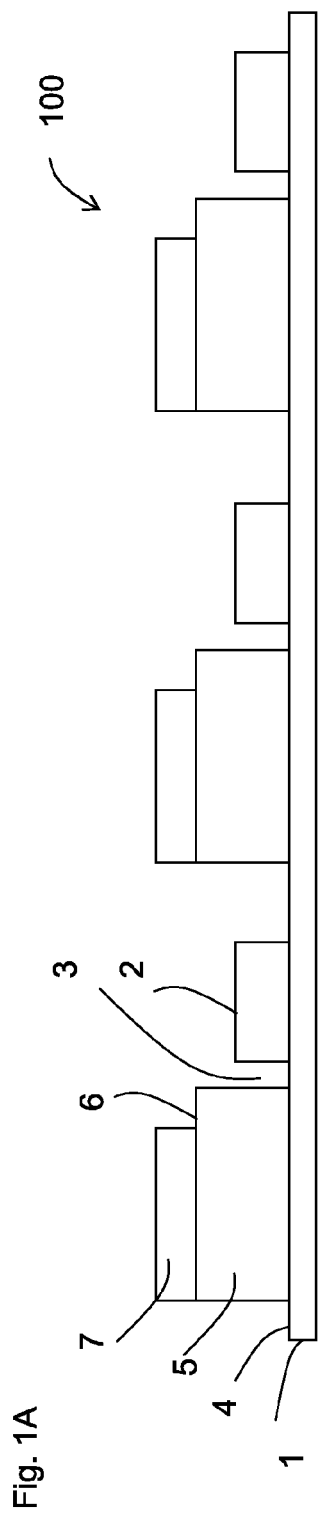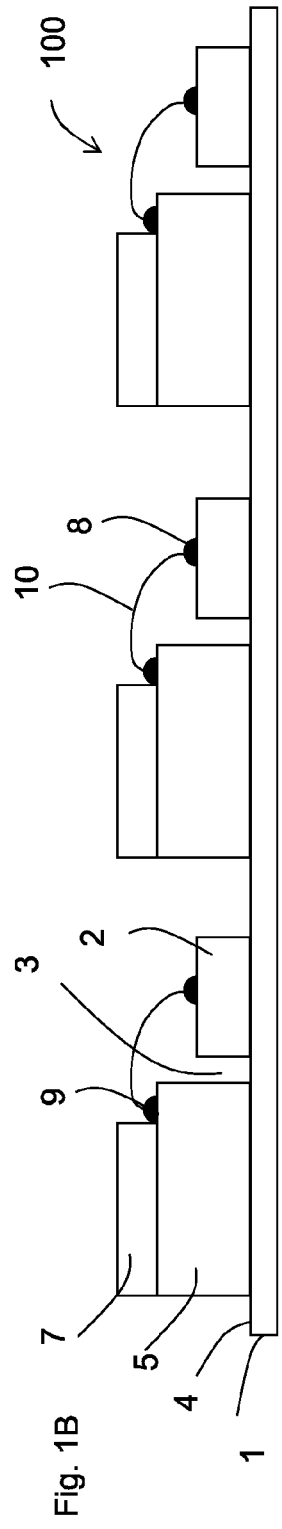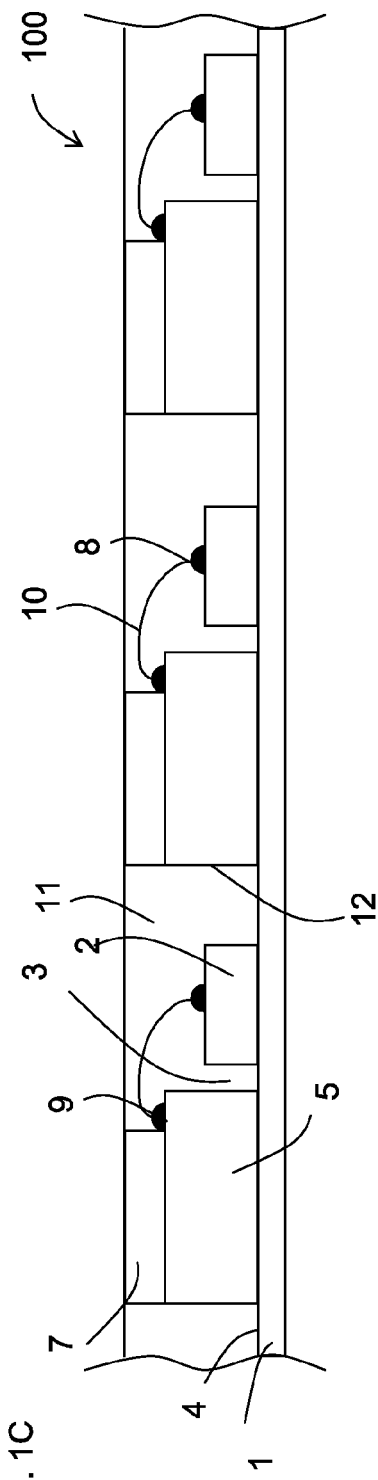

METHOD FOR PRODUCING AN OPTOELECTRONIC SEMICONDUCTOR DEVICE, AND OPTOELECTRONIC SEMICONDUCTOR DEVICE

This patent application is a national phase filing under section 371 of PCT/EP2013/076977, filed Dec. 17, 2013, which claims the priority of German patent application 10 2012 113 003.5, filed Dec. 21, 2012, each of which is incorporated herein by reference in its entirety.

TECHNICAL FIELD

The present invention relates to a method for producing an optoelectronic semiconductor component and an optoelectronic semiconductor component.

SUMMARY

Embodiments of the invention specify a simplified method for producing an optoelectronic semiconductor component. Further embodiments specify an optoelectronic semiconductor component which is particularly efficient and can be produced particularly simply.

A proposed method comprises the steps of providing a carrier and a conductor structure, which is formed with an electrically conductive material and has a plurality of openings. In addition, the method comprises arranging the conductor structure on an upper side of the carrier, wherein the upper side is exposed in the openings of the conductor structure. Furthermore, the method comprises providing a plurality of optoelectronic semiconductor chips, wherein each optoelectronic semiconductor chip comprises a layer at least on an upper side of the respective semiconductor chip. The layer can be a phosphor layer. Alternatively, the layer can be a layer which is transmissive, in particular transparent, to the radiation emitted by the respective semiconductor chip, in particular a decoupling or coupling layer. The layer is preferably not part of a semiconductor body of each optoelectronic semiconductor chip.

Furthermore, the method comprises arranging a plurality of optoelectronic semiconductor chips on the upper side of the carrier in the openings of the conductor structure. The conductor structure can be embodied, for example, as an electrically conductive conductor frame or can comprise such a frame. In other words, the optoelectronic semiconductor chips can be arranged in the openings in each case adjacent to or between frame elements of the conductor frame, in particular without the optoelectronic semiconductor chips being partially or completely arranged on the conductor structure and/or on another conductive element. In this case, at least or precisely one optoelectronic semiconductor chip can be arranged in each opening of the conductor structure.

The method furthermore comprises the formation of an electrical connection between a terminal point of each optoelectronic semiconductor chip and the conductor structure and the molding of a molded body around each optoelectronic semiconductor chip and the electrical connection, wherein the molded body at least partially covers the lateral surfaces of all optoelectronic semiconductor chips and the molded body does not protrude beyond the optoelectronic semiconductor chips on the upper side thereof facing away from the carrier. In addition, the method comprises the removal of the carrier and the isolation of at least the molded body to create optoelectronic semiconductor components, wherein each optoelectronic semiconductor component comprises at least one optoelectronic semiconductor chip. Each optoelectronic semiconductor component can have a part of the molded body after the isolation.

The optoelectronic semiconductor components are a light-emitting diode in each case, for example, which is provided for emitting radiation. Alternatively, the optoelectronic semiconductor components can also be a radiation detector or a photodiode. The optoelectronic semiconductor chips are, for example, a radiation-emitting semiconductor chip, for example, a light-emitting diode chip, a photodiode chip, or also a laser diode chip.

The term "radiation" refers in the present invention in particular to electromagnetic radiation, for example, visible, preferably mixed color, in particular white light.

The carrier is a temporary carrier, which is removed again before the isolation, for example. The carrier can be, for example, a film, or a plate in general, which is formed using a plastic material, a metal, a ceramic material, or a semiconductor material.

The conductor structure and the optoelectronic semiconductor chips are preferably fastened on the carrier so that a mechanical connection results between the optoelectronic semiconductor chips and the carrier, which can be detached again later nondestructively for the conductor structure and the optoelectronic semiconductor chips. An adhesive layer or sacrificial layer could additionally or alternatively be arranged for this purpose between the conductor structure or the optoelectronic semiconductor chips and the carrier. The conductor structure and the optoelectronic semiconductor chips are preferably glued onto the upper side of the carrier. Alternatively, the fastening on the upper side of the carrier can also be performed using other means.

For the case in which the above-mentioned layer is a phosphor layer, it can consist of or contain a luminescence conversion material, for example. This luminescence conversion material can contain phosphor particles. For example, the luminescence conversion material is an yttrium-aluminum-garnet doped with cerium, YAG in short, and/or a lutetium-aluminum-garnet, LuAG in short, and/or a lutetium-yttrium-aluminum garnet, LuYAG in short. Furthermore, the luminescence conversion material can also be a correspondingly doped semiconductor material, for example, a II-VI compound semiconductor material such as ZnSe or a III-V compound semiconductor material such as AlInGaN. The luminescence conversion material can also be a doped silicon nitride or silicon oxynitride or silicate or aluminate. For example, the luminescence conversion material is an alkaline earth silicon nitride doped with $Eu^{2+}$ and/or an alkaline earth aluminum silicon nitride, wherein the alkaline earth metal is barium or calcium or strontium, for example.

Furthermore, radiation generated by the optoelectronic semiconductor chips in operation can be absorbed by the luminescence conversion material and reemitted in a wavelength range which differs from the wavelength range in which the optoelectronic semiconductor chips emit. For example, shortwave radiation which is emitted from the optoelectronic semiconductor chips can be converted into longer wave radiation by means of absorption into the luminescence conversion material and subsequent reemission. For example, the optoelectronic semiconductor chips can emit blue light in operation. After a corresponding conversion, yellow light can then be reemitted from the phosphor layer, so that mixed color, in particular white light, results. The phosphor particles can be introduced in this case into a matrix material, for example, silicone or ceramic.

For the case that the above-mentioned layer is a transparent layer and/or a decoupling or coupling layer, advantageously, the respective optoelectronic semiconductor chip can be protected thereby against external influences or radiation emitted thereby or to be detected thereby can be decoupled or coupled in, respectively.

The molded body is molded around or envelops the optoelectronic semiconductor chips, without protruding beyond them on the upper side thereof facing away from the carrier. The upper side of the optoelectronic semiconductor chips facing away from the carrier is preferably the upper side of the optoelectronic semiconductor chips comprising the layer or formed thereby.

In other words, the molded body terminates flush with the optoelectronic semiconductor chips on the upper side of the optoelectronic semiconductor chips or the molded body is only partially molded around or envelops the optoelectronic semiconductor chips on the lateral surfaces of the optoelectronic semiconductor chips. The molded body preferably envelops the optoelectronic semiconductor chips in a form-fitting manner in this case.

In a preferred embodiment of the method, the terminal points of the optoelectronic semiconductor chips for the electrical connections of the optoelectronic semiconductor chips to the conductor structure are each arranged on the upper side of the optoelectronic semiconductor chips. The terminal points are preferably each arranged adjacent to the layers on the upper side of the semiconductor body of the optoelectronic semiconductor chips.

In a preferred embodiment of the method, the molded body is molded around or envelops the electrical connections completely, such that the electrical connections do not protrude out of the molded body. In this case, the molded body advantageously protects the electrical connections against fractures or cracks from external influences. The molded body can additionally advantageously insulate the electrical connections.

Multiple optoelectronic semiconductor chips can also be connected to the conductor structure by one electrical connection.

The removal of the carrier can be performed, for example, by heating or by step-by-step thinning of the carrier. The heating can be performed by means of a laser beam, for example. The thinning can be performed, for example, by grinding down the carrier. It is additionally possible that the removal is performed by chemical dissolving of the carrier or of the sacrificial layer or adhesive layer which is optionally provided on the carrier. After the removal of the carrier, the lower sides of the optoelectronic semiconductor chips, which originally faced toward the carrier, are preferably freely accessible or exposed.

One advantage of the proposed method relates to the possibility of producing compact optoelectronic semiconductor components, the structural height of which is as small as possible. Using the proposed method, a plurality of optoelectronic semiconductor components can preferably be produced, wherein the height of each optoelectronic semiconductor component is not greater than the height of the optoelectronic semiconductor chips including the layers. Each optoelectronic semiconductor chip can have a contact, for example, made of an electrically conductive material, such as a metal, preferably gold or silver, on its lower side. The contact can be exposed after the removal of the carrier.

Due to the small component height of the optoelectronic semiconductor components produced by the present method, a majority of the heat arising in the optoelectronic semiconductor components can advantageously be dissipated rapidly, for example, via the lower sides of the optoelectronic semiconductor components. In other words, a heat transport distance is comparatively short due to the small component height. Due to this optimized heat dissipation, less heating results in operation and therefore—in the case of radiation-emitting optoelectronic semiconductor components—a higher luminous flux and therefore a higher efficiency and a longer service life. Due to the lesser heating, furthermore, the efficiency of each optoelectronic semiconductor component is subject to lesser variations in operation. In the case of photodiodes as the optoelectronic semiconductor components, optimized heat dissipation advantageously reduces the probability of the occurrence of thermally generated charge carriers or a dark current induced thereby.

In a preferred embodiment of the method, the respective electrical connection comprises a contact wire, which connects the terminal point of the optoelectronic semiconductor chip to the conductor structure.

The contact wires can be connected by a suitable bonding method to the terminal point or to the conductor structure, respectively. The contact wires are preferably bonded using an ultrasonic bonding method. One advantage of the mentioned embodiment is that chip-bond processes are not required during the production method. In such a process, the chip is stably fastened on a conductor part and connected thereto in an electrically conductive manner. Omitting such chip-bond processes additionally offers the advantage that copper migration, which originates from the copper of a chip-bond solder and can finally make the chip unusable, can be avoided during the production of the optoelectronic semiconductor components. In particular in the case of light-emitting diode chips, which are based on the material system InGaAlP, a significant brightness loss can occur due to such a copper migration. In addition, a strong heat transfer during the formation of the electrical connection to the optoelectronic semiconductor chips can be prevented by the wire bonding, since the contact wires—in contrast to chip-bond processes—only have a comparatively small contact area and additionally such high temperatures are not typically required during the wire bonding.

Furthermore, due to the low heat transfer to the optoelectronic semiconductor chips during the formation of the electrical connections using contact wires, for example, temperature-sensitive plastics or adhesives can be used during the production of the optoelectronic semiconductor components. Furthermore, the production is simplified by the contacting by means of contact wires in that during the contacting in the production of the optoelectronic semiconductor components, the heating and cooling times of the composite of carrier, optoelectronic semiconductor chips, and conductor structure can be kept low. The method can thus be carried out in an accelerated manner or can be simplified.

In one advantageous embodiment of the method, the molded body is implemented as radiation-transmissive. This enables radiation which arises in the optoelectronic semiconductor chips, in the case in which the optoelectronic semiconductor chips are implemented for radiation generation, to not only be emitted via the upper sides, but rather also via the lateral surfaces of the optoelectronic semiconductor chips and to also be able to leave the optoelectronic semiconductor components. The efficiency of the optoelectronic semiconductor components is thus advantageously increased, since no or less radiation is absorbed on the lateral surfaces of the optoelectronic semiconductor chips than would be the case with an absorbent molded body. The upper sides of the optoelectronic semiconductor chips can be a main emission surface of the optoelectronic semiconductor chips.

In one advantageous embodiment of the method, the molded body terminates flush with the optoelectronic semiconductor chips on the upper side of the optoelectronic semiconductor chips. The molded body can thus advantageously stabilize the optoelectronic semiconductor chips as reliably as possible before the isolation of the molded body, wherein a small component height of the optoelectronic semiconductor components is achieved simultaneously.

In one preferred embodiment of the method, the optoelectronic semiconductor chips protrude beyond the molded body in a direction away from the upper side of the carrier. This embodiment offers the advantage that in addition to the molded body, a further material, for example, a radiation-reflecting material can be applied or deposited on an upper side of the molded body or on the lateral surfaces of the optoelectronic semiconductor chips, without the mentioned material protruding beyond the optoelectronic semiconductor chips on the upper side thereof facing away from the carrier. The upper side of the molded body is in this case a side of the molded body, facing away from the carrier, which can be exposed before the application of the radiation-reflecting material, for example.

In one advantageous embodiment of the method, before the removal of the carrier, a reflective envelope is applied to the side of the molded body facing away from the carrier, wherein the reflective envelope does not protrude beyond the optoelectronic semiconductor chips on the upper side thereof facing away from the carrier. In other words, the reflective envelope can at least partially cover lateral surfaces of all optoelectronic semiconductor chips. The component height of the optoelectronic semiconductor components can advantageously be kept low by this embodiment. The reflective envelope is implemented to reflect radiation entering therein. Radiation which is emitted or decoupled via the lateral surfaces of the optoelectronic semiconductor chips or via lateral surfaces of the layers of the optoelectronic semiconductor chips and/or the layers can thus advantageously be reflected by the reflective envelope such that the fraction of the radiation emitted via the surfaces or main emission surfaces of the optoelectronic semiconductor components is increased. The efficiency of the optoelectronic semiconductor components can therefore advantageously also be increased.

According to this embodiment, the molded body can preferably be molded around or envelop the optoelectronic semiconductor chips up to a height of the layers, in particular in a formfitting manner, so that the lateral surfaces of the optoelectronic semiconductor chips are covered up to the layers by the molded body. Alternatively, the molded body can envelop or be molded around the optoelectronic semiconductor chips such that the molded body partially envelops or is molded around the lateral surfaces of the layers, or the molded body envelops or is molded around the lateral surfaces of the optoelectronic semiconductor chips only up to a height below the layers.

The reflective envelope preferably terminates flush with the layers of the optoelectronic semiconductor chips.

In one advantageous embodiment of the method, at least one contact wire is arranged partially in the molded body and partially in the reflective envelope. According to this embodiment, the reflective envelope is molded around, envelops, or encapsulates the optoelectronic semiconductor chips and the electrical connections in a formfitting manner.

Furthermore, an optoelectronic semiconductor component is specified. The optoelectronic semiconductor component is preferably producible or produced by means of one of the methods described here, in particular, all features disclosed for the method are also disclosed for the optoelectronic semiconductor component and vice versa. The optoelectronic semiconductor component preferably has in this case a plurality of optoelectronic semiconductor chips, so that in particular features which relate in the method, for example, to a plurality of optoelectronic semiconductor chips, can also relate in the optoelectronic semiconductor component to one of the corresponding elements.

In one advantageous embodiment, the optoelectronic semiconductor component comprises an optoelectronic semiconductor chip, which comprises a layer on an upper side and a conductor structure, which is formed using an electrically conductive material and has at least one opening, in which the optoelectronic semiconductor chip is arranged. Furthermore, the optoelectronic semiconductor component comprises a contact wire, which connects a terminal point of the optoelectronic semiconductor chip to the conductor structure. Furthermore, the optoelectronic semiconductor component comprises a molded body, wherein the lateral surfaces of the optoelectronic semiconductor chip and the contact wire are at least partially covered by the molded body, and a reflective envelope, which is molded around the optoelectronic semiconductor chip in a region protruding beyond the molded body. In the optoelectronic semiconductor component, the optoelectronic semiconductor chip protrudes beyond the molded body, wherein the reflective envelope does not protrude beyond the optoelectronic semiconductor chip on its upper side.

The optoelectronic semiconductor chip can be arranged in the opening adjacent to or between one or more frame elements of the conductor frame, in particular without the optoelectronic semiconductor chip being arranged partially on the conductor structure.

In one advantageous embodiment of the optoelectronic semiconductor component, the contact wire is arranged partially in the molded body and partially in the reflective envelope. The contact wire can thus advantageously be protected or insulated by the reflective envelope from external influences, for example, against fractures or cracks, in regions at which the molded body is not molded around or does not envelop the contact wire. Furthermore, with simultaneous stabilization of the optoelectronic semiconductor chip and the conductor structure by the molded body, a substantial radiation fraction can be reflected by the reflective envelope such that the fraction of the radiation emitted via the surfaces or main emission surfaces of the optoelectronic semiconductor components is increased.

In one advantageous embodiment of the optoelectronic semiconductor component, the terminal point is arranged on the upper side of the optoelectronic semiconductor chip or a semiconductor body of the optoelectronic semiconductor chip. For example, the p-contact or the n-contact of a diode, on the upper side of the optoelectronic semiconductor chip, can thus advantageously be connected via the electrical connection to the conductor structure.

In one advantageous embodiment of the optoelectronic semiconductor component, the reflective envelope comprises a silicone or a mixture of a silicone and an epoxy. A matrix material for additional radiation-reflective or radiation-scattering components of the reflective envelope can advantageously be provided by these materials.

In one advantageous embodiment of the optoelectronic semiconductor component, the reflective envelope comprises radiation-reflective particles, which consist at least of one of the materials $TiO_2$, $BaSO_4$, ZnO, $Al_xO_y$, and $ZrO_2$ or contain at least one of the mentioned materials. Radiation can advantageously be scattered or reflected by the mentioned particles of the reflective envelope by way of this embodiment.

In one advantageous embodiment of the optoelectronic semiconductor component, lateral surfaces of the optoelectronic semiconductor component, in particular of the molded body, have traces of a material removal, in particular sawing grooves or grinding marks. These traces of the material removal can originate from the isolation of the molded body. The traces of the material removal mean a roughening of the lateral surfaces of the optoelectronic semiconductor component or the molded body. By way of this roughening, radiation which is emitted via the lateral surfaces of the optoelectronic semiconductor chip can advantageously be decoupled or emitted from the optoelectronic semiconductor component more easily, since a total reflection of radiation on the lateral surfaces can be reduced by the traces of the material removal.

In one advantageous embodiment of the optoelectronic semiconductor component, a lower side of the optoelectronic semiconductor chip is exposed. By way of this embodiment, a small component height of the optoelectronic semiconductor component can advantageously be achieved. Furthermore, in this way a contact point on the lower side of the optoelectronic semiconductor component is accessible.

In one advantageous embodiment of the optoelectronic semiconductor component, the lower side of the conductor structure is also exposed, so that both contacts required for operating the optoelectronic semiconductor component are exposed on the same side of the optoelectronic semiconductor component. In particular, surface-mountable optoelectronic semiconductor components can thus advantageously be produced.

BRIEF DESCRIPTION OF THE DRAWINGS

Further advantages, advantageous embodiments, and expedient features of the invention result from the following description of the exemplary embodiments in conjunction with the figures.

FIGS. 1A to 1E show a first exemplary embodiment of the described method on the basis of schematic sectional illustrations;

Figure 1D:
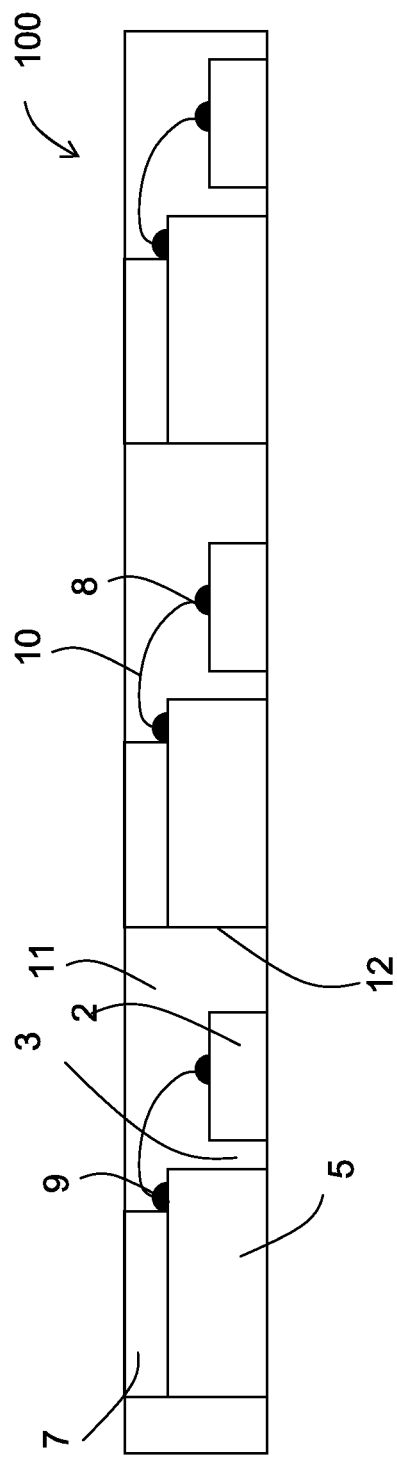

Identical, similar, and identically acting elements are provided with the same reference signs in the figures. The figures and the size relationships of elements illustrated in the figures among one another are not to scale. Rather, individual elements can be shown exaggeratedly large for better illustration ability and/or for better comprehension.

DETAILED DESCRIPTION OF ILLUSTRATIVE EMBODIMENTS

FIG. 1A shows first method steps on the basis of a schematic sectional view of an optoelectronic semiconductor component 100. Firstly, a carrier 1 and a conductor structure 2 having openings 3 are provided. The conductor structure 2 can be embodied as a metal conductor frame. The conductor structure 2 is furthermore arranged on an upper side 4 of the carrier 1, wherein the upper side 4 is level and is exposed in the openings 3 of the conductor structure 2. The conductor structure 2 can be embodied, for example, as an electrically conductive conductor frame, in particular as a metal conductor frame, which preferably comprises copper having a gold or silver coating or consists thereof. Furthermore, a plurality of optoelectronic semiconductor chips 5 is provided. Each optoelectronic semiconductor chip 5 has an upper side 6, on which each optoelectronic semiconductor chip 5 comprises a layer 7 in each case. The layer 7 can have a thickness of 80 µm to 300 µm. The layer 7 is preferably exclusively arranged on the respective upper side 6 of the semiconductor chip 5 and does not protrude beyond the semiconductor chip 5 in a direction parallel to the upper side 6 of the semiconductor chip 5. The layer 7 is preferably a phosphor layer. Alternatively, the layer 7 can also be another layer, for example, a layer which is transmissive, in particular transparent, to the radiation emitted by the respective optoelectronic semiconductor chip 5, in particular a decoupling or coupling layer. In this case, the layer can have a glass or a silicone. The layer 7 is preferably not part of a semiconductor body of each optoelectronic semiconductor chip 5. Each semiconductor body can form the respective optoelectronic semiconductor chip 5 together with the layer 7 arranged thereon in each case.

In the exemplary embodiments shown here, the optoelectronic semiconductor chips 5 are preferably LED chips, which are arranged on the upper side 4 of the carrier 1 in the openings 3 of the conductor structure 2. However, photodiode chips or laser diode chips can also be used as the optoelectronic semiconductor chips. The optoelectronic semiconductor chips 5 are arranged in one plane in this case. For example, the conductor structure 2 and the optoelectronic semiconductor chips 5 are fastened on the carrier 1 so that a mechanical connection results between the optoelectronic semiconductor chips 5 and the carrier 1, which can be nondestructively detached again later for the conductor structure 2 and the optoelectronic semiconductor chips 5. For this purpose, an adhesive layer or sacrificial layer could additionally or alternatively be arranged between the conductor structure 2 or the optoelectronic semiconductor chips 5 and the carrier 1. The conductor structure 2 and the optoelectronic semiconductor chips 5 are preferably glued onto the upper side 4 of the carrier 1. Alternatively, the fastening on the upper side 4 of the carrier 1 can also be performed using other means.

In the exemplary embodiments shown here, three optoelectronic semiconductor chips or semiconductor components are shown in cross section as examples of a plurality of optoelectronic semiconductor chips 5. The figures shown are furthermore to be interpreted so that the optoelectronic semiconductor chips or semiconductor components are arranged two-dimensionally on the upper side 4 of the carrier 1.

FIG. 1B shows, on the basis of a schematic sectional view of the optoelectronic semiconductor component 100, the formation of an electrical connection 8 between a terminal point 9 of each optoelectronic semiconductor chip 5 and the conductor structure 2 as a further method step. The electrical connections 8 comprise contact wires 10, which connect the terminal points 9 of the optoelectronic semiconductor chips 5 to the conductor structure 2. The electrical connections to the contact wires 10 can be formed, for example, by means of a suitable wire bonding or ultrasonic bonding method. The contact wires 10 preferably consist of gold.

FIG. 1C shows, on the basis of a schematic sectional view of the optoelectronic semiconductor component 100, a further method step, in which a molded body 11 is molded around the optoelectronic semiconductor chips 5 and the electrical connections 8. The molded body 11 at least partially covers lateral surfaces 12 of all optoelectronic semiconductor chips 5. The lateral surfaces 12 connect the upper sides 6 of the optoelectronic semiconductor chips 5 to the lower sides 13 of the optoelectronic semiconductor chips 5, which face away from the upper sides 6. The molded body 11 terminates flush with the layers 7 of the optoelectronic semiconductor chips 5, so that the molded body 11 does not protrude beyond the optoelectronic semiconductor chips 5 on the upper side 6 thereof facing away from the carrier 1. In this case, the molded body 11 is molded around, envelops, or encapsulates the lateral surfaces 12 of the optoelectronic semiconductor chips 5 and additionally the electrical connections 8. For example, the molded body 11 can be in direct contact with the lateral surfaces 12 and can completely cover the lateral surfaces 12. The molded body 11 additionally has a mechanically stabilizing property for the optoelectronic semiconductor component 100.

The molding around or enveloping can be performed, for example, by means of injection molding, spraying, casting, printing, laminating on a film, or similar methods, wherein the molded body 11 contains a mechanically stabilizing material, for example, a plastic, a low-melting-point glass, a low-melting-point glass ceramic, an epoxy resin, silicone, an epoxy-silicone hybrid material, glass, or a glass ceramic or is formed from one of these materials.

FIG. 1D shows, on the basis of a schematic sectional view of the optoelectronic semiconductor component 100, the removal of the carrier 1. The removal of the carrier can be performed, for example, by heating or step-by-step thinning of the carrier. In this case, the carrier can preferably be completely removed.

It is additionally provided in the scope of the present invention that the removal of the carrier is performed by chemical removal or by chemical removal of a sacrificial layer or adhesive layer (not shown) arranged between the carrier and the optoelectronic semiconductor chips. After the removal of the carrier 1, the lower sides 13 of the optoelectronic semiconductor chips 5, which originally faced toward the carrier 1, are freely accessible or exposed.

The height of the optoelectronic semiconductor component 100 corresponds in FIG. 1D to the height of the optoelectronic semiconductor chips 5 (including the layers 7). Thus, in a direction away from the upper side 4 of the carrier 1, in particular no part of the carrier 1 and/or the molded body 11 and/or the contact wires 10 protrudes beyond the semiconductor chips 5. It is furthermore provided in the scope of the present invention that the optoelectronic semiconductor chips 5 have an electrical contact on the lower sides 13, for example, in the form of a contact layer (not shown), preferably made of gold or silver.

Figure 1E:
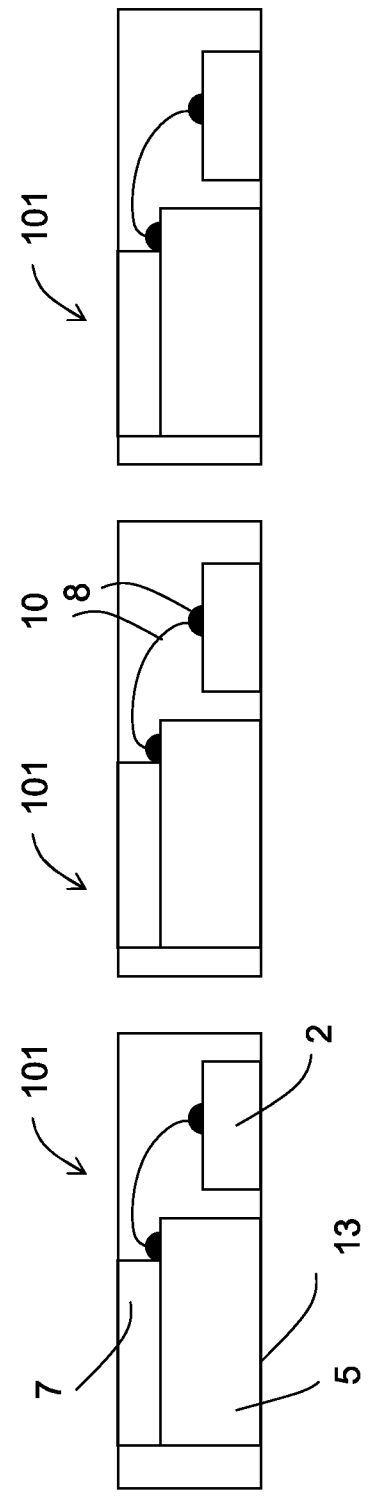

FIG. 1E shows, on the basis of a schematic sectional view of the optoelectronic semiconductor component 100, the isolation of the molded body 11 to create optoelectronic semiconductor components 101, which each comprise an optoelectronic semiconductor chip 5, which is connected via an electrical connection 8 to the conductor structure 2.

Figure 2A:
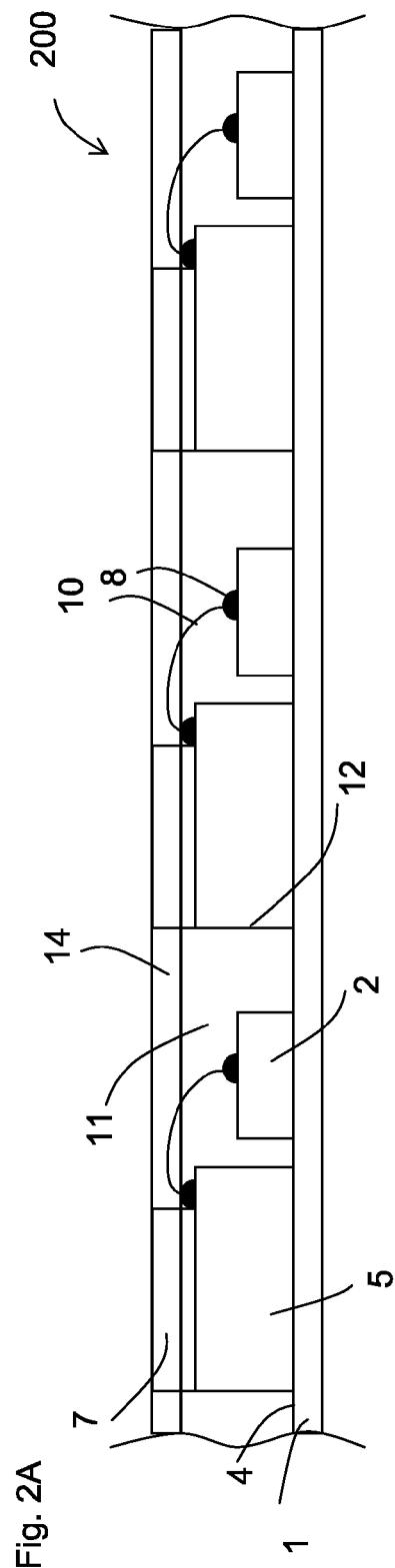
FIG. 2A shows partial steps of a second exemplary embodiment of the described method on the basis of schematic sectional illustrations.

FIG. 2A shows, on the basis of a schematic sectional view, a method step of a further exemplary embodiment of the described method. This method step corresponds to that shown in FIG. 1C, wherein the molded body 11 is molded around the optoelectronic semiconductor chips 5, however, such that the optoelectronic semiconductor chips 5 protrude beyond the molded body 11 in a direction away from the upper side 4 of the carrier 1. Furthermore, before the removal of the carrier 1, a reflective envelope 14 is applied to the side of the molded body 11 facing away from the carrier 1 here, wherein the reflective envelope 14 does not protrude beyond the optoelectronic semiconductor chips 5 on the upper side 6 thereof. The reflective envelope 14 terminates flush with the layers 7 of the optoelectronic semiconductor chips 5 along the upper side 6 of the semiconductor chips 5. The reflective envelope 14 can comprise a silicone or a mixture of a silicone and an epoxy and can additionally contain radiation-reflective particles. These particles can consist of one of the materials $TiO_2$, $BaSO_4$, $ZnO$, $Al_xO_y$, and $ZrO_2$ or contain at least one of the mentioned materials.

"Reflective" can mean in this context that the reflective envelope 14 at least has a reflectivity of 80%, preferably of greater than 90%, for the radiation incident thereon from the optoelectronic semiconductor chips 5 and/or the phosphor layers 7.

In the exemplary embodiment from FIG. 2A, the carrier 1 is firstly removed after the application of the reflective envelope 14, analogously to the method step shown in FIG. 1D. After the removal of the carrier 1, the lower sides 13 of the optoelectronic semiconductor chips 5, which originally faced toward the carrier 1, are freely accessible or exposed (see, e.g., FIG. 2B). The height of the optoelectronic semiconductor component 200 corresponds to the height of the optoelectronic semiconductor chips 5 without the carrier 1, but including the layers 7.

Figure 2B:
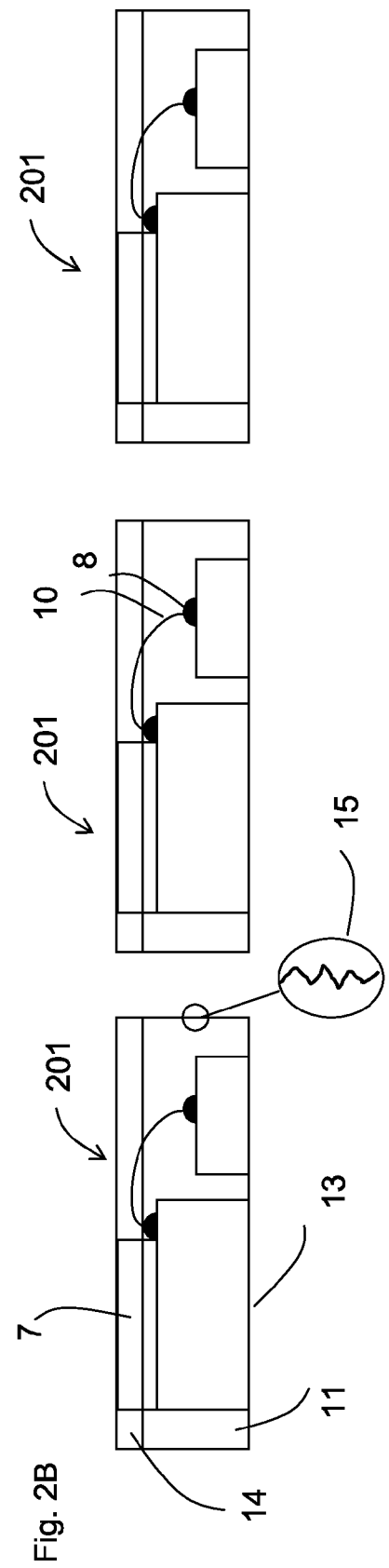
FIG. 2B shows optoelectronic semiconductor components described on the basis of schematic sectional illustrations.

FIG. 2B shows, on the basis of a schematic sectional view, an optoelectronic semiconductor component 201 according to the invention or a plurality thereof. This plurality is created by the isolation of the molded body 11 according to the exemplary embodiment illustrated in FIG. 2A after the removal of the carrier 1. The isolation is performed here analogously to the method step shown in FIG. 1E, wherein in addition to the molded body 11, the reflective envelope 14 is additionally isolated, so that a plurality of optoelectronic semiconductor components 201 is created. These each comprise the molded body 11 and the reflective envelope 14. Lateral surfaces 12 of the optoelectronic semiconductor chips 5 and the contact wires 10 are partially covered by the molded body 11. The reflective envelope 14 is molded around or envelops the optoelectronic semiconductor chips 5 in regions protruding beyond the molded body 11, wherein the optoelectronic semiconductor chips 5 protrude beyond the molded body 11 and the reflective envelope 14 does not protrude beyond the optoelectronic semiconductor chips 5 on the upper sides 6 thereof.

Contacting for the operation of the optoelectronic semiconductor components 101 and 201 can be performed according to the exemplary embodiments shown via the lower sides 13 of the optoelectronic semiconductor chips 5 and via the conductor structure 2.

Alternatively, an optoelectronic semiconductor component can also comprise multiple optoelectronic semiconductor chips, wherein each optoelectronic semiconductor chip is connected via an electrical connection to a separate or shared conductor structure.

Lateral surfaces 12 of the optoelectronic semiconductor components 201, which are formed by the molded body 11, have traces of a material removal 15. The material removal can originate from the isolation. The traces of the material removal 15 can be sawing grooves or grinding marks depending on the isolation method.

The invention is not restricted thereto by the description on the basis of the exemplary embodiments. Rather, the invention comprises every novel feature and every combination of features, which includes in particular every combination of features in the patent claims, even if this feature or this combination is not explicitly specified itself in the patent claims or exemplary embodiments.

The invention claimed is:

1. An optoelectronic semiconductor component comprising:
   an optoelectronic semiconductor chip that comprises a layer on an upper side;
   a conductor structure that comprises an electrically conductive material and has an opening in which the optoelectronic semiconductor chip is arranged;
   a contact wire that electrically connects a terminal point of the optoelectronic semiconductor chip to the conductor structure;
   a molded body, wherein lateral surfaces of the optoelectronic semiconductor chip and the contact wire are at least partially covered by the molded body and wherein the optoelectronic semiconductor chip extends beyond the molded body; and
   a reflective envelope molded around the optoelectronic semiconductor chip in a region extending beyond the molded body, wherein the reflective envelope does not extend beyond the optoelectronic semiconductor chip on its upper side,
   wherein a lower side of the optoelectronic semiconductor chip is freely accessible.

2. The optoelectronic semiconductor component according to claim 1, wherein a lower side of the optoelectronic semiconductor chip is exposed.

3. The optoelectronic semiconductor component according to claim 1, wherein the contact wire is arranged partially in the molded body and partially in the reflective envelope.

4. The optoelectronic semiconductor component according to claim 1, wherein the terminal point is arranged on the upper side of the optoelectronic semiconductor chip.

5. The optoelectronic semiconductor component according to claim 1, wherein the reflective envelope comprises a silicone or a mixture of a silicone and an epoxy.

6. The optoelectronic semiconductor component according to claim 1, wherein the reflective envelope comprises radiation-reflective particles selected from the group consisting of $TiO_2$, $BaSO_4$, ZnO, $Al_xO_y$, and $ZrO_2$ and combinations thereof.

7. The optoelectronic semiconductor component according to claim 1, wherein lateral surfaces of the optoelectronic semiconductor component have traces of a material removal.

8. The optoelectronic semiconductor component according to claim 7, wherein the lateral surface of the optoelectronic semiconductor component has sawing grooves or grinding marks.

9. An optoelectronic semiconductor component comprising:
   an optoelectronic semiconductor chip comprising a layer on an upper side;
   a conductor structure comprising an electrically conductive material and having opening in which the optoelectronic semiconductor chip is arranged,
   a contact wire electrically connecting a terminal point of the optoelectronic semiconductor chip to the conductor structure;
   a molded body, wherein lateral surfaces of the optoelectronic semiconductor chip and the contact wire are at least partially covered by the molded body, and wherein the optoelectronic semiconductor chip extends beyond the molded body; and
   a reflective envelope molded around the optoelectronic semiconductor chip in a region extending beyond the molded body, wherein the contact wire is arranged partially in the molded body and partially in the reflective envelope, and wherein the reflective envelope does not extend beyond the optoelectronic semiconductor chip on its upper side.

* * * * *